United States Patent
Senshu

(10) Patent No.: US 12,092,954 B2
(45) Date of Patent: Sep. 17, 2024

(54) IMPRINT APPARATUS, IMPRINT METHOD, AND ARTICLE MANUFACTURING METHOD

(71) Applicant: CANON KABUSHIKI KAISHA, Tokyo (JP)

(72) Inventor: Kohei Senshu, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 28 days.

(21) Appl. No.: 17/198,767

(22) Filed: Mar. 11, 2021

(65) Prior Publication Data
US 2021/0302831 A1   Sep. 30, 2021

(30) Foreign Application Priority Data

Mar. 30, 2020  (JP) ................................. 2020-061107

(51) Int. Cl.
G03F 7/00   (2006.01)
(52) U.S. Cl.
CPC ................. *G03F 7/0002* (2013.01)
(58) Field of Classification Search
CPC ..... G03F 7/0002; G03F 9/7042; H01L 21/027
See application file for complete search history.

(56) References Cited

U.S. PATENT DOCUMENTS

| 2007/0146671 A1* | 6/2007 | Lee ..................... G03F 7/70108 355/53 |
| 2016/0216616 A1* | 7/2016 | Bittner ................ G03F 7/70308 |
| 2019/0086796 A1 | 3/2019 | Murasato |

FOREIGN PATENT DOCUMENTS

| DE | 102015220144 A1 * | 4/2017 | |
| JP | 2019054212 A | 4/2019 | |
| WO | WO-2011039864 A1 * | 4/2011 | ........... G02B 5/0215 |

* cited by examiner

*Primary Examiner* — Emmanuel S Luk
*Assistant Examiner* — Victoria Bartlett
(74) *Attorney, Agent, or Firm* — ROSSI, KIMMS & McDOWELL LLP

(57) ABSTRACT

Provided is an imprint apparatus that forms a pattern on a shot region of a substrate by curing an imprint material on the shot region by light irradiation in a state in which the imprint material is in contact with a mold. The apparatus comprises a shutter plate, and an adjuster configured to adjust a state of the shutter plate to control the light irradiation to the imprint material on the shot region, wherein the shutter plate includes a first passing portion used to irradiate a portion of an entire portion of the imprint material on the shot region with light, and the adjuster adjusts a tilt of the shutter plate.

9 Claims, 12 Drawing Sheets

IMPRINT APPARATUS, IMPRINT METHOD, AND ARTICLE MANUFACTURING METHOD

BACKGROUND OF THE INVENTION

Field of the Invention

The present invention relates to an imprint apparatus, an imprint method, and an article manufacturing method.

Description of the Related Art

An imprint apparatus forms a pattern on a shot region of a substrate by curing an imprint material on the shot region by light irradiation in a state in which the imprint material is in contact with a mold. In the imprint apparatus, the shot region and the mold can be aligned in the state in which the imprint material on the shot region is in contact with the mold. This alignment can be performed while an alignment error between the shot region of the substrate and the mold is detected by an alignment scope.

It is known that if the viscoelasticity of the imprint material on the shot region at the time of alignment is too low, the alignment accuracy can be decreased. Therefore, in order to increase the viscoelasticity of the imprint material on the shot region upon performing alignment, it has been proposed that preceding exposure is performed in which at least a portion of the imprint material is irradiated with light in advance. For example, Japanese Patent Laid-Open No. 2019-54212 describes an imprint apparatus in which a passing portion, which is used to irradiate a portion of an imprint material on a shot region with light, is provided in a shutter plate, and alignment is performed after the viscoelasticity of the portion of the imprint material is increased by light having passed through the passing portion.

In the imprint technique, further improvement in alignment accuracy is desired. To achieve this, it is required that the exposure amount in preceding exposure can be adjusted more precisely.

SUMMARY OF THE INVENTION

The present invention provides a technique advantageous in improving the alignment accuracy.

The present invention in its one aspect provides an imprint apparatus that forms a pattern on a shot region of a substrate by curing an imprint material on the shot region by light irradiation in a state in which the imprint material is in contact with a mold, the apparatus comprising a shutter plate, and an adjuster configured to adjust a state of the shutter plate to control the light irradiation to the imprint material on the shot region, wherein the shutter plate includes a first passing portion used to irradiate a portion of an entire portion of the imprint material on the shot region with light, and the adjuster adjusts a tilt of the shutter plate.

Further features of the present invention will become apparent from the following description of exemplary embodiments (with reference to the attached drawings).

DESCRIPTION OF THE EMBODIMENTS

Figure 1:
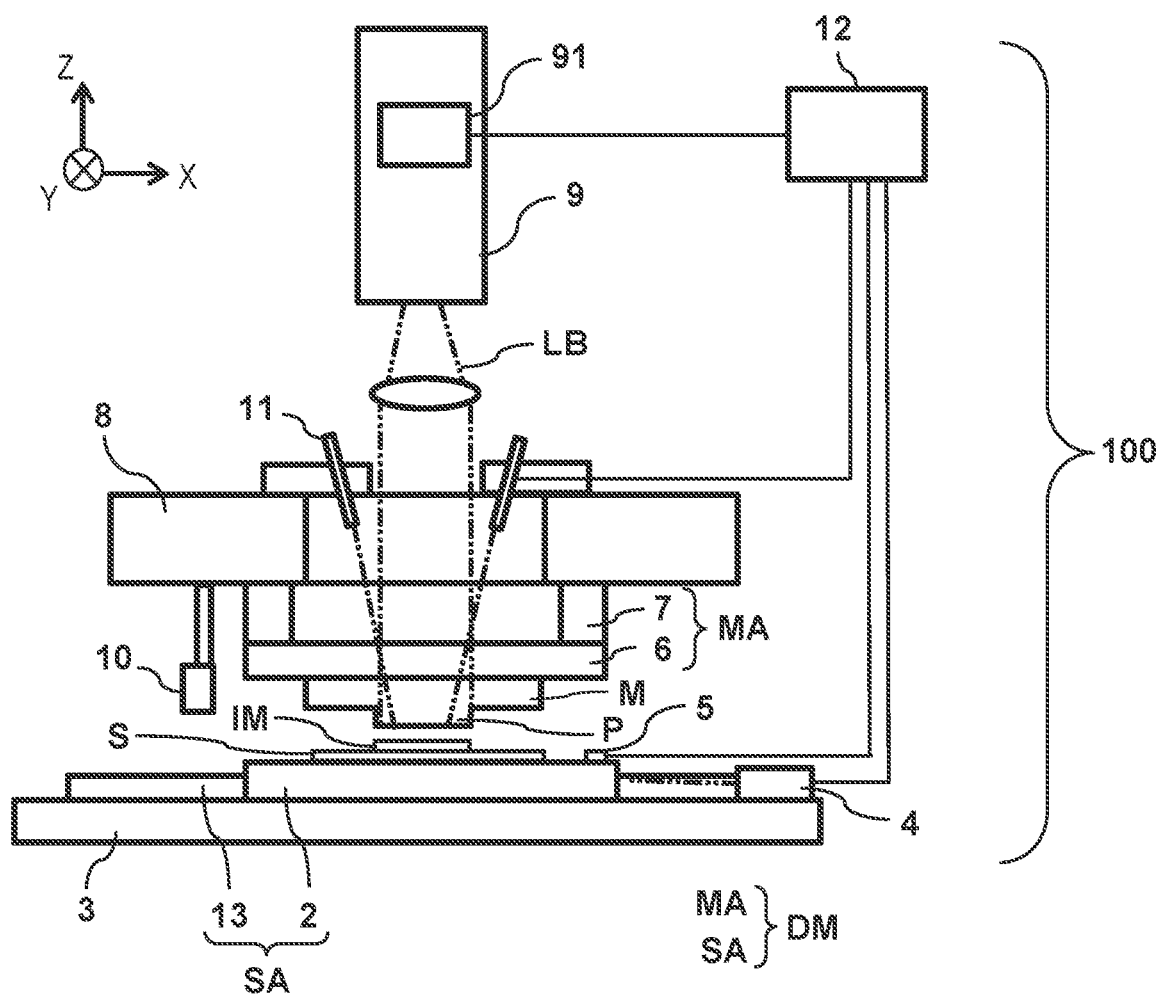
FIG. 1 is a view showing the arrangement of an imprint apparatus.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

FIG. 1 shows the arrangement of an imprint apparatus 100 according to an embodiment of the present invention. The imprint apparatus 100 forms a pattern on a shot region of a substrate S by curing an imprint material IM on the shot region by light irradiation in a state in which the imprint material IM is in contact with a mold M (a pattern portion P thereof).

As the imprint material, a photo-curable composition (to be also referred to a resin in an uncured state) to be cured by light irradiation is used. The light has, for example, a wavelength within a range of 10 nm (inclusive) to 1 mm (inclusive) and can be, for example, infrared light, visible light, ultraviolet light, or the like. The photo-curable composition contains at least a polymerizable compound and a photopolymerization initiator, and may contain a nonpolymerizable compound or a solvent, as needed. The nonpolymerizable compound is at least one type of material selected from a group comprising of a sensitizer, a hydrogen donor, an internal mold release agent, a surfactant, an antioxidant, a polymer component, and the like. The imprint material can be arranged on the substrate in the form of droplets or in the form of an island or film formed by connecting a plurality of droplets. The viscosity (the viscosity at 25° C.) of the imprint material can be, for example, 1 mPa·s (inclusive) to 100 mPa·s (inclusive). As the material of the substrate, for example, glass, a ceramic, a metal, a semiconductor, a resin, or the like can be used. A member made of a material different from the substrate may be provided on the surface of the substrate, as needed. The substrate is, for example, a silicon wafer, a compound semiconductor wafer, or silica glass.

In the specification and the accompanying drawings, directions will be indicated on an XYZ coordinate system in which directions parallel to the surface of a substrate S are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively. Control or driving concerning the X-axis, the Y-axis, and the Z-axis means control or driving concerning a direction parallel to the X-axis, a direction parallel to the Y-axis, and a direction parallel to the Z-axis, respectively. In addition, control or driving concerning the θX-axis, the θY-axis, and the θZ-axis means control or driving concerning a rotation about an axis parallel to the X-axis, a rotation about an axis parallel to the Y-axis, and a rotation about an axis parallel to the Z-axis, respectively. In addition, a position is information that can be specified based on coordinates on the X-, Y-, and Z-axes, and a posture is information that can be specified by values on the θX-, θY-, and θZ-axes. Positioning means controlling the position and/or posture. Alignment can include controlling the position and/or posture of at least one of the substrate and the mold.

The imprint apparatus 100 includes a relative driving mechanism DM that changes the relative position between the substrate S (shot region thereof) and the mold M. The relative driving mechanism DM can include a substrate positioning mechanism SA that holds and positions the substrate S, and a mold positioning mechanism MA that holds and positions the mold M. The relative driving mechanism DM drives at least one of the substrate S and the mold M so as to change the relative position between the substrate S and the mold M. Changing the relative position by the relative driving mechanism DM can include bringing the mold M into contact with the imprint material IM on the substrate S, driving for separating the mold M from the cured imprint material (a pattern of a cured product), and aligning the shot region of the substrate S and the mold M.

The substrate positioning mechanism SA can include a substrate stage 2 including a substrate chuck that holds the substrate S, a substrate driving mechanism 13 that drives the substrate S by driving the substrate stage 2, and a sensor 4 that detects the position and posture of the substrate stage 2. The substrate stage 2 can include a sensor 5 that measures a light amount. The substrate driving mechanism 13 is supported by a base frame 3. The mold positioning mechanism MA can include a mold holding unit 6 that holds the mold M, and a mold driving mechanism 7 that drives the mold M by driving the mold holding unit 6. The mold driving mechanism 7 can be supported by a support member 8.

The substrate driving mechanism 13 can be configured to drive the substrate S about a plurality of axes (for example, three axes of the X-, Y-, and θZ-axes, and preferably, six axes of the X-, Y-, Z-, θX-, θY-, and θZ-axes). The mold driving mechanism 7 can be configured to drive the mold M about a plurality of axes (for example, three axes of the Z-axis, the θX-axis, and the θY-axis, and preferably six axes of the X-axis, the Y-axis, the Z-axis, the θX-axis, the θY-axis, and the θZ-axis). The sensor 4 can include, for example, a laser interferometer or an encoder.

The imprint apparatus 100 further includes a curing unit 9 (light irradiation unit) that cures the imprint material IM on a shot region of the substrate S. The curing unit 9 cures the imprint material IM by irradiating the imprint material IM with light after alignment between the shot region and the mold M in a state in which the imprint material IM on the shot region of the substrate S is in contact with the mold M (pattern portion P thereof) is completed. Thus, a pattern made of a cured product of the imprint material IM is formed on the substrate S. In addition, the curing unit 9 also performs processing of irradiating a portion (preceding exposure portion) of the imprint material IM on the shot region with light after the imprint material IM on the shot region of the substrate S is brought into contact with the mold M (pattern portion P thereof) to increase the viscoelasticity of the portion. The details of the curing unit 9 will be described later.

The imprint apparatus 100 can further include a dispenser 10 that arranges the imprint material IM on a shot region of the substrate S. Here, the imprint apparatus 100 can be configured such that every time the imprint material IM is arranged in one shot region by the dispenser 10, an imprint process is performed on the shot region. Alternatively, the imprint apparatus 100 may be configured to perform an imprint process on each of a plurality of shot regions after the imprint material IM is arranged in the plurality of shot regions by the dispenser 10. Alternatively, the dispenser 10 may be formed as an external apparatus of the imprint apparatus 100 and, in this case, the substrate S with the imprint material arranged thereon by the dispenser 10 as the external apparatus is provided to the imprint apparatus 100.

The imprint apparatus 100 can further include an alignment scope 11. The alignment scope 11 detects, for example, the relative position between an alignment mark in a shot region of the substrate S and an alignment mark of the mold M. Thus, a relative positional shift (alignment error) between the shot region of the substrate S and the mold M can be detected. Alignment between the shot region of the substrate S and the mold M can be performed by adjusting the relative position between the substrate S and the mold M by the relative driving mechanism DM while detecting a relative positional shift between the shot region and the mold M by the alignment scope 11.

The imprint apparatus 100 can further include a control unit 12. The control unit 12 controls each of the above-described components of the imprint apparatus 100. The control unit 12 can be formed from, for example, a PLD (Programmable Logic Device) such as an FPGA (Field Programmable Gate Array), an ASIC (Application Specific Integrated Circuit), a general-purpose computer installed with a program, or a combination of all or some of these components.

The substrate S to be positioned by the substrate positioning mechanism SA and the mold M to be positioned by the mold positioning mechanism MA can be vibrated independently by receiving a vibration from the outside or a vibration generated in the imprint apparatus 100. This is due to the insufficient rigidity of a structure (the substrate positioning mechanism SA, the mold positioning mechanism MA, the support member 8, or the like) between the substrate S and the mold. Therefore, there can be a relative positional shift (relative vibration) between the substrate S and the mold M and between the shot region as the alignment target and the mold M.

Figure 2A:
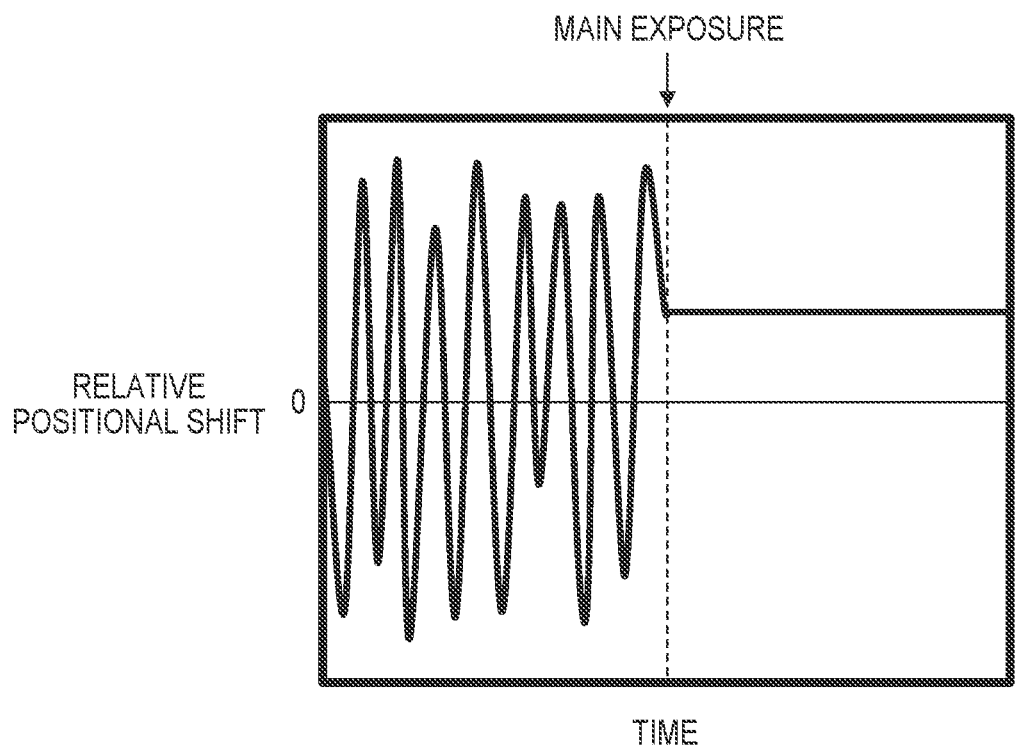
FIGS. 2A and 2B are graphs for explaining preceding exposure.

FIG. 2A exemplifies the relative positional shift (relative vibration) between the shot region of the substrate S and the mold M in an alignment operation in a comparative example. Here, the alignment operation is performed by the relative driving mechanism DM in a state in which the imprint material IM on the shot region of the substrate S is in contact with the mold M (pattern portion P thereof). In FIG. 2A, "main exposure" indicates a timing at which the curing unit 9 irradiates the entire portion of the imprint material IM with light (the imprint material IM is exposed) and the imprint material IM is cured. A period from the left end in FIG. 2A to "main exposure" is a period in which the relative driving mechanism DM aligns the shot region of the substrate S and the mold M.

When the curing unit 9 irradiates the entire portion of the imprint material IM with light and the imprint material IM is cured, the substrate S and the mold M are coupled with each other by the cured imprint material IM. In this state, no relative vibration exists between the shot region of the substrate S and the mold M, and the relative positional shift is fixed. This relative positional shift becomes an overlay error between the pattern formed by the imprint process and the underlying pattern.

Figure 2B:
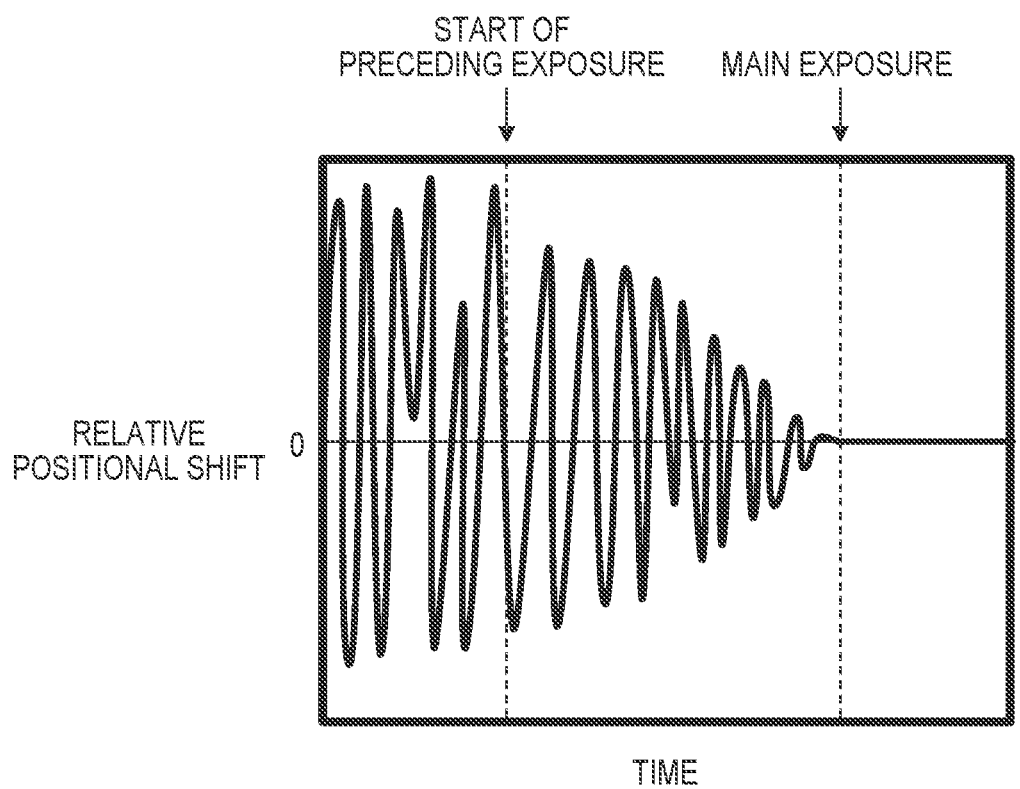

FIG. 2B exemplifies the relative positional shift (relative vibration) between the shot region of the substrate S and the mold M in an alignment operation according to this embodiment. In FIG. 2B, "main exposure" indicates a timing at which the curing unit 9 irradiates the entire portion of the imprint material IM with light (the imprint material IM is exposed) and the imprint material IM is cured. A period from the left end in FIG. 2B to "main exposure" is a period in which the relative driving mechanism DM aligns the shot region of the substrate S and the mold M. "Start of preceding exposure" indicates a timing at which preceding exposure is started. In this embodiment, in the state in which the imprint material IM on the shot region of the substrate S is in contact with the mold M, the curing unit 9 irradiates, with light, a preceding exposure portion which is a portion of the entire portion of the imprint material IM on the shot region of the substrate S. Accordingly, of the entire portion of the imprint material IM on the shot region of the substrate S, only the preceding exposure portion is selectively exposed. This is referred to as preceding exposure. Preceding exposure is also referred to as preliminary exposure.

When the preceding exposure is started, the viscoelasticity of the preceding exposure portion of the imprint material IM is increased. An increase in viscoelasticity of the preceding exposure portion of the imprint material IM means an increase in rigidity between the substrate S and the mold M. Accordingly, after the preceding exposure is started, the amplitude of the relative positional shift between the shot region of the substrate S and the mold M gradually decreases. This can improve the alignment accuracy. In addition, by exposing only the preceding exposure portion of the imprint material on the shot region, a decrease in filling property in a portion other than the preceding exposure portion can be suppressed. This can improve the throughput. The preceding exposure portion can be arbitrarily determined in consideration of the filling property.

Light irradiation ("main exposure") to cure the imprint material IM on the shot region of the substrate in the entire area of the shot region is performed at a timing at which the relative positional shift between the shot region of the substrate S and the mold M falls within an allowable range.

Figure 3:
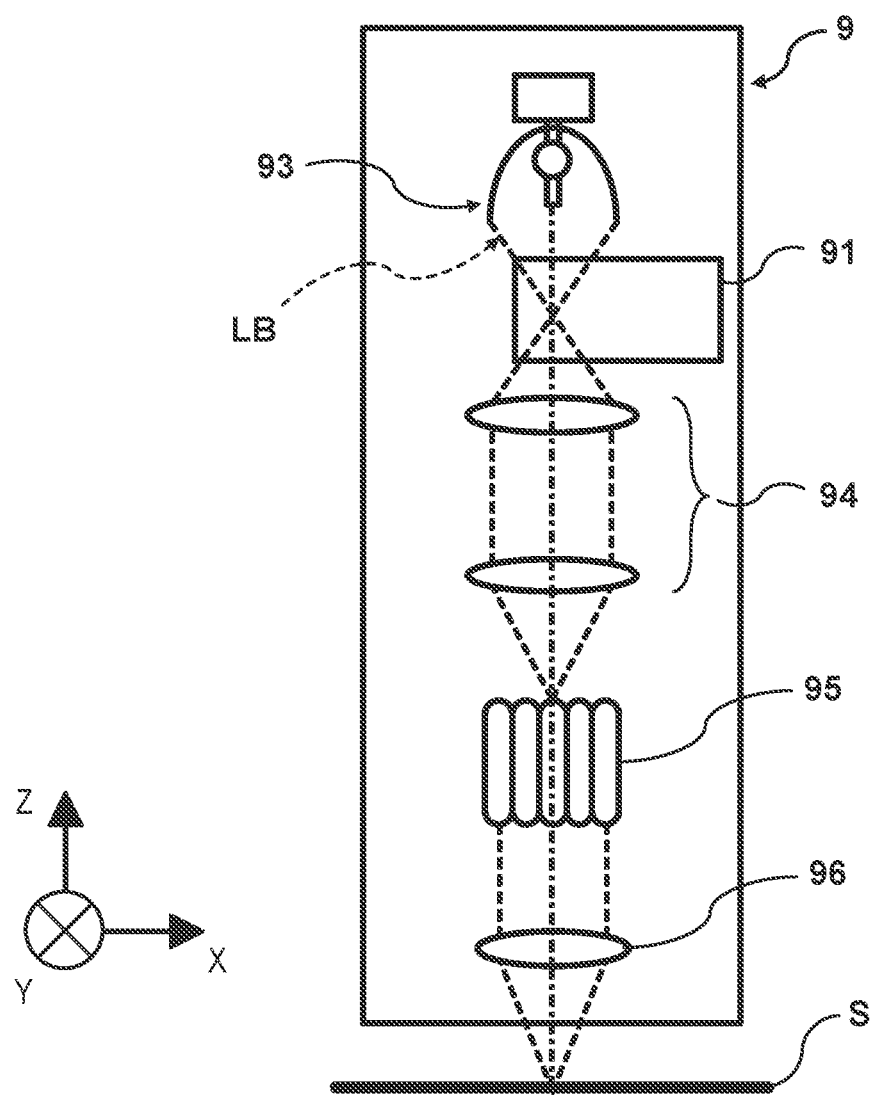
FIG. 3 is a view showing an example of the arrangement of a curing unit.

FIG. 3 shows an example of the arrangement of the curing unit 9. The curing unit 9 can include a light source 93, a shutter mechanism 91, an imaging optical system 94, a fly-eye lens 95, and an imaging optical system 96. The light source 93 can be, for example, a lamp such as a mercury lamp, or a solid-state light source such as a laser or an LED.

Figure 4A:
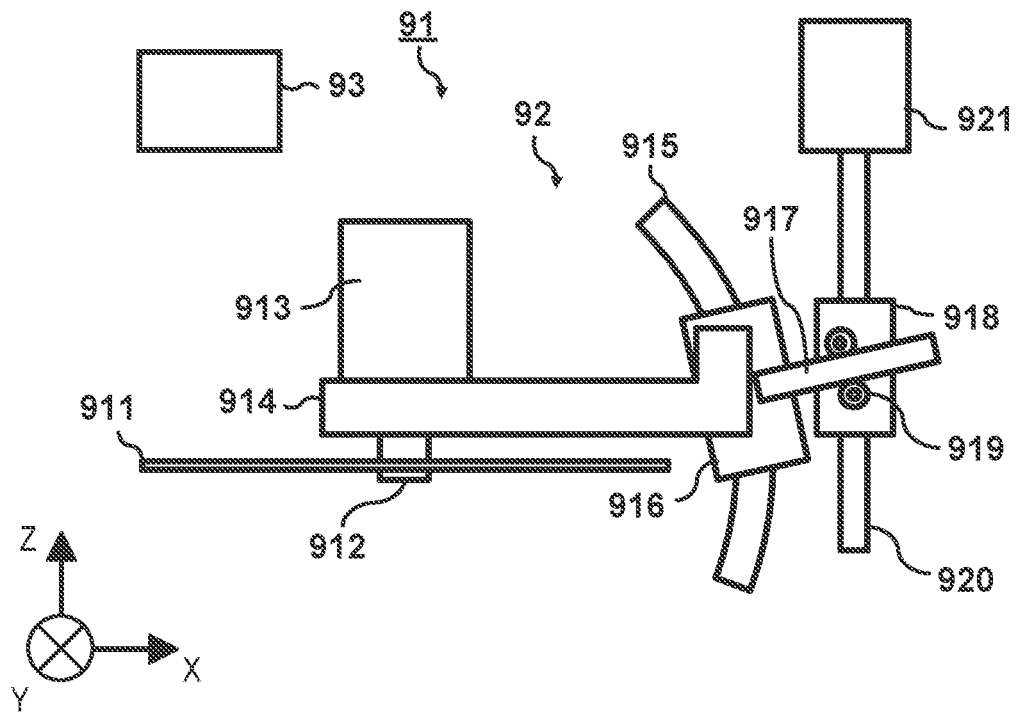
FIGS. 4A and 4B are views showing an example of the arrangement of a shutter mechanism.
Figure 4B:
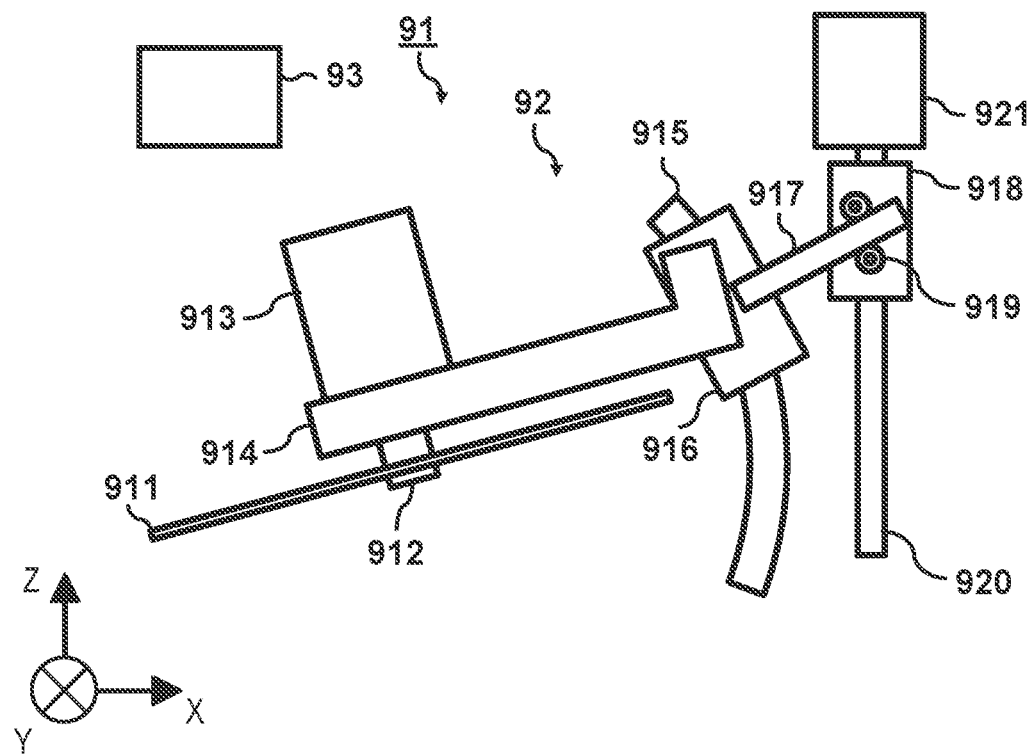

FIGS. 4A and 4B are views showing an example of the arrangement of the shutter mechanism 91. The shutter mechanism 91 can include a shutter plate 911 and an adjuster 92 that adjusts the state of the shutter plate 911 to control light irradiation to the imprint material on the shot region. The adjuster 92 can include an actuator 913 used to perform a shutter operation by the shutter plate 911. For example, the actuator 913 can be configured so as to cause the shutter plate 911 to pivot via a driving shaft 912, but may be configured so as to drive (reciprocate) the shutter plate 911 in one axial direction.

As shown in FIG. 3, an intermediate image of the light source 93 can be formed on a plane where the shutter plate 911 is arranged. The imaging optical system 94 can be configured such that the plane where the shutter plate 911 is arranged and the incident plane of the fly-eye lens 95 optically have a conjugate positional relationship. The imaging optical system 96 can be configured such that the incident plane of the fly-eye lens 95 and the substrate S optically have a conjugate positional relationship. Note that the fly-eye lens 95 can be arranged between the shutter plate 911 and the substrate S, but an arrangement may be employed in which the light intensity distribution (passing portion) on the plane where the shutter plate 911 is arranged is directly imaged on the substrate S.

The adjuster 92 includes a mechanism that adjusts the tilt of the shutter plate 911. In the example shown in FIGS. 4A and 4B, the adjuster 92 can include a tilt mechanism used to tilt the shutter plate 911 and the actuator 913. The actuator 913 is held by a holding member 914. The holding member 914 is connected to a first slider 916 configured to move along an R guide 915. A second slider 918 is attached to a ball screw 920 (driving shaft) arranged along the Z direction. The ball screw 920 is attached to the output shaft of an actuator 921. A rotational movement of the ball screw 920 generated by driving of the actuator 921 is converted into a Z-direction linear movement of the second slider 918. The first slider 916 and the second slider 918 are connected by a rod 917. One end of the rod 917 is connected to the first slider 916 so as to be rotatable around the Y-axis, and the intermediate portion of the rod 917 is sandwiched by a pair of cam followers 919 arranged on the second slider 918. Accordingly, as the second slider 918 is moved in the Z direction by driving of the actuator 921, the first slider 916 moves along the R guide 915. This can tilt the shutter plate 911 and the actuator 913. FIG. 4A shows a state in which the shutter plate 911 is adjusted to be perpendicular to the Z direction (optical axis direction), and FIG. 4B shows a state in which the shutter 911 and the actuator 913 are tilted from the state shown in FIG. 4A.

Figure 5:
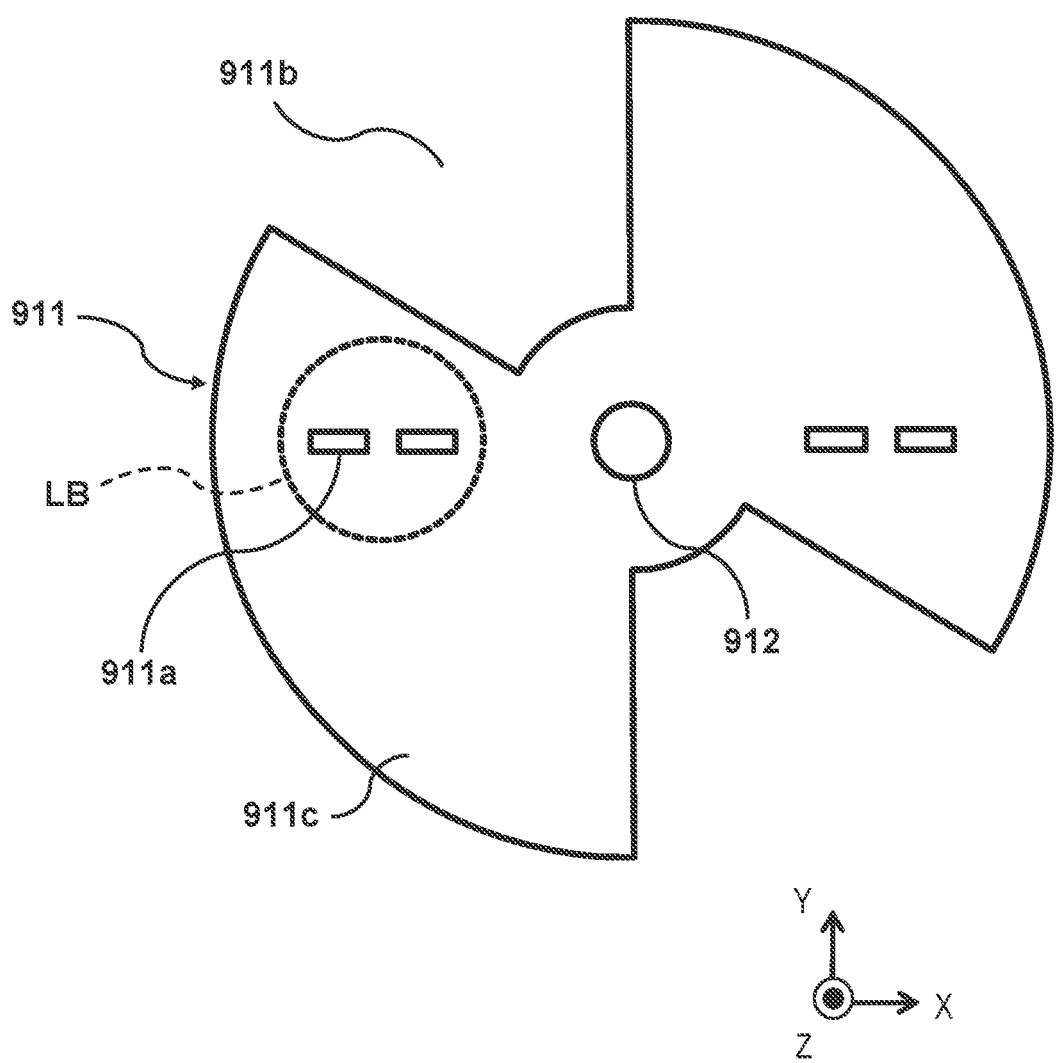
FIG. 5 is a view showing an example of the arrangement of a shutter plate.

FIG. 5 shows an example of the arrangement of the shutter plate 911. In FIG. 5, a broken line indicates an area (light path) where light LB from the light source 93 enters. The shutter plate 911 includes a shielding portion 911c that shields the light LB from the light source 93. The shutter plate 911 further includes a first passing portion 911a used to irradiate the preceding exposure portion, which is a portion of the entire portion of the imprint material IM on the shot region, with light, and a second passing portion 911b used to irradiate the entire portion of the imprint material IM on the shot region with light. The shutter plate 911 has a two-fold symmetrical structure in this example, but it may have another structure. The adjuster 92 can switch the state of the shutter plate 911 between a first state in which light having passed through the first passing portion 911a irradiates the preceding exposure portion and a second state in which light having passed through the second passing portion 911b irradiates the entire portion of the imprint material IM on the shot region. This switching can be performed by pivoting the shutter plate 911 by the actuator 913 (first actuator).

Figure 6:
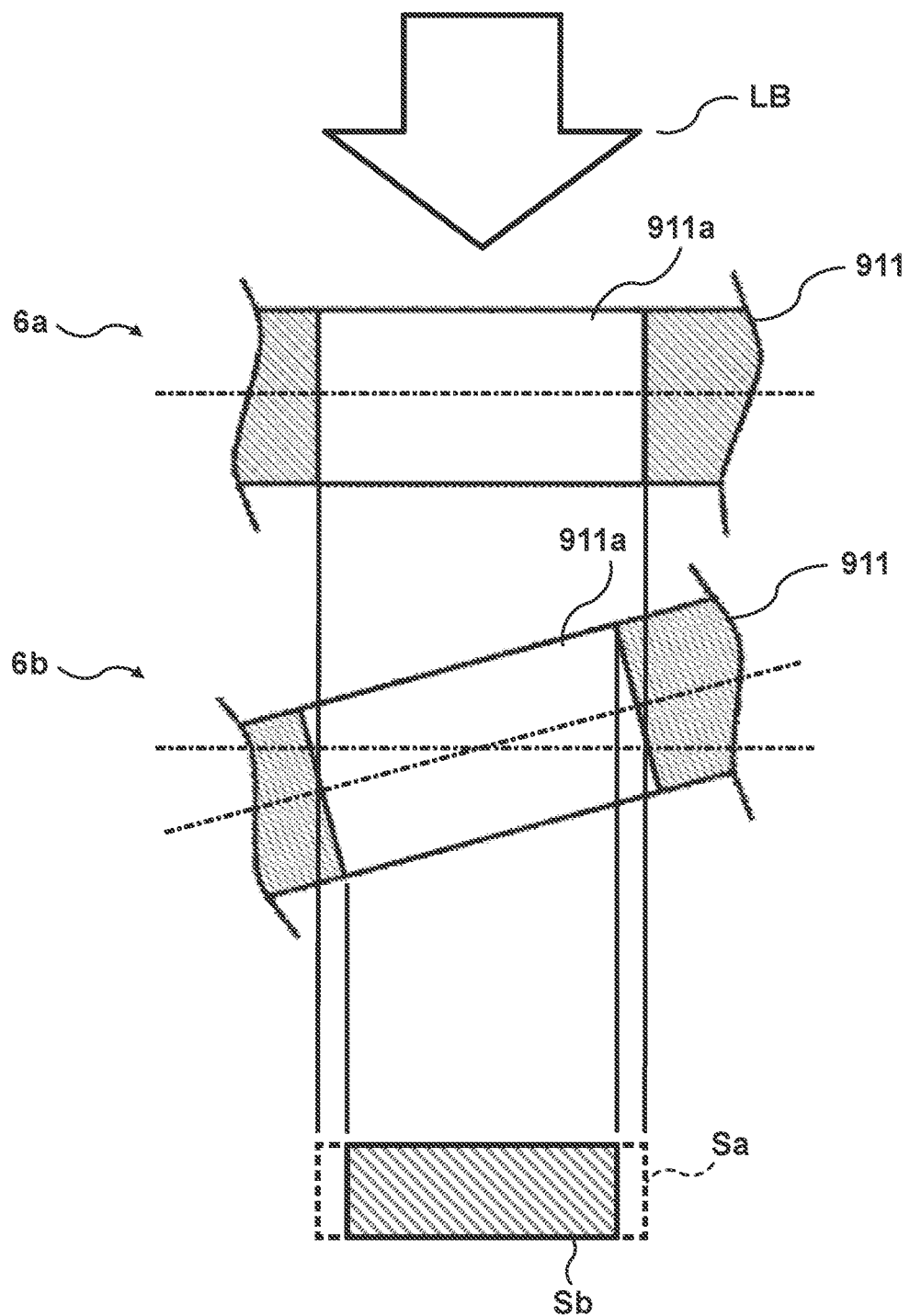
FIG. 6 is a view showing a change in projection area of light passing through a first passing portion with respect to a tilt of the shutter plate.

FIG. 6 shows an example of a change in projection area of light passing through the first passing portion 911a with respect to the tilt of the shutter plate 911. A state 6a shows a state in which the shutter plate 911 is perpendicular to the optical axis of the light LB from the light source 93. The projection area of the light passing through the first passing portion 911a in this state is indicated by reference symbol Sa. A state 6b shows a state in which the shutter plate 911 is tilted from the state 6a. By tilting the shutter plate 911, the projection area of light passing through the first passing portion 911a changes from the area Sa to an area Sb. Since the projection area changes, the passing amount (exposure amount) of the light LB changes.

Figure 7:
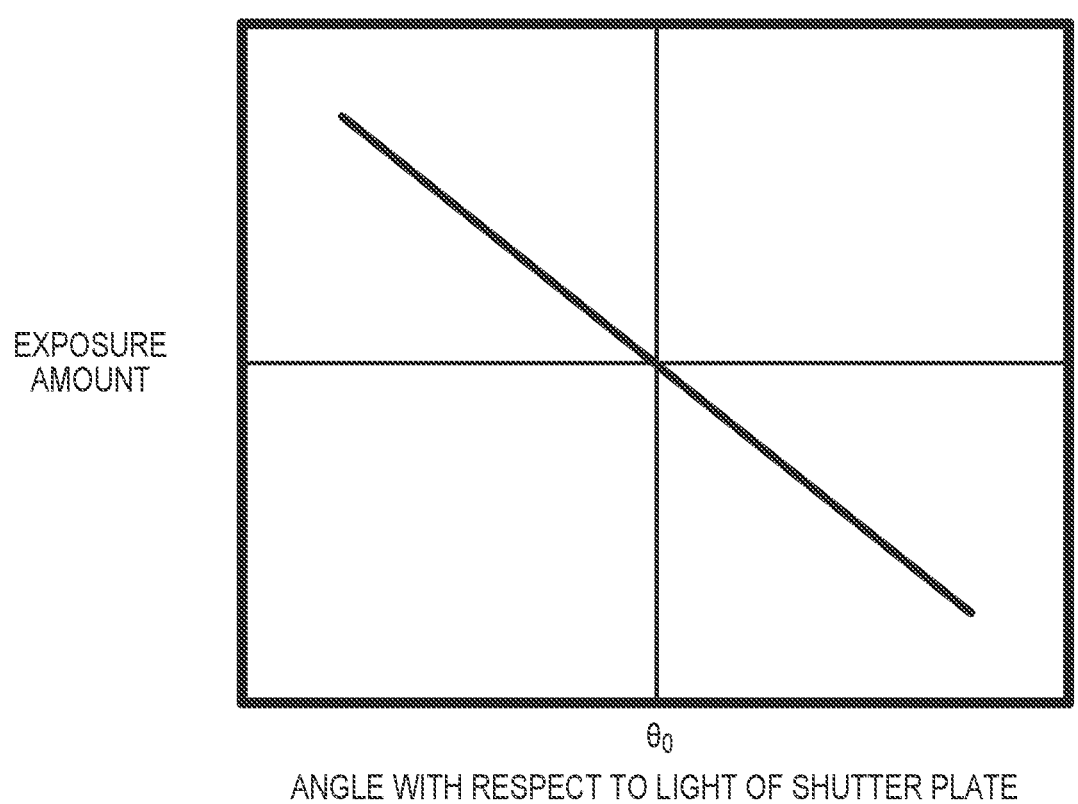
FIG. 7 is a graph exemplifying the relationship between the angle of the shutter plate and the exposure amount.

FIG. 7 exemplifies the relationship between the angle of the shutter plate 911 with respect to the light LB and the exposure amount. FIG. 7 shows the exposure amount in an angle range of a standard angle $\theta_0$ and its vicinity. If the exposure light reflected by the shutter plate 911 is reversely propagated toward the light source, thermal fluctuations can occur in the light source. Therefore, the standard angle $\theta_0$ is normally set at an angle not perpendicular but oblique to the optical axis of the light LB. As shown in FIG. 7, the exposure amount can be changed by changing the angle of the shutter plate 911. Based on the characteristic as described above, the adjuster 92 can adjust the tilt of the shutter plate 911 so as to adjust the amount of light passing through the first passing portion 911a. A tilt operation of the shutter plate 911 can be performed by the actuator 921 (second actuator).

Figure 8A:
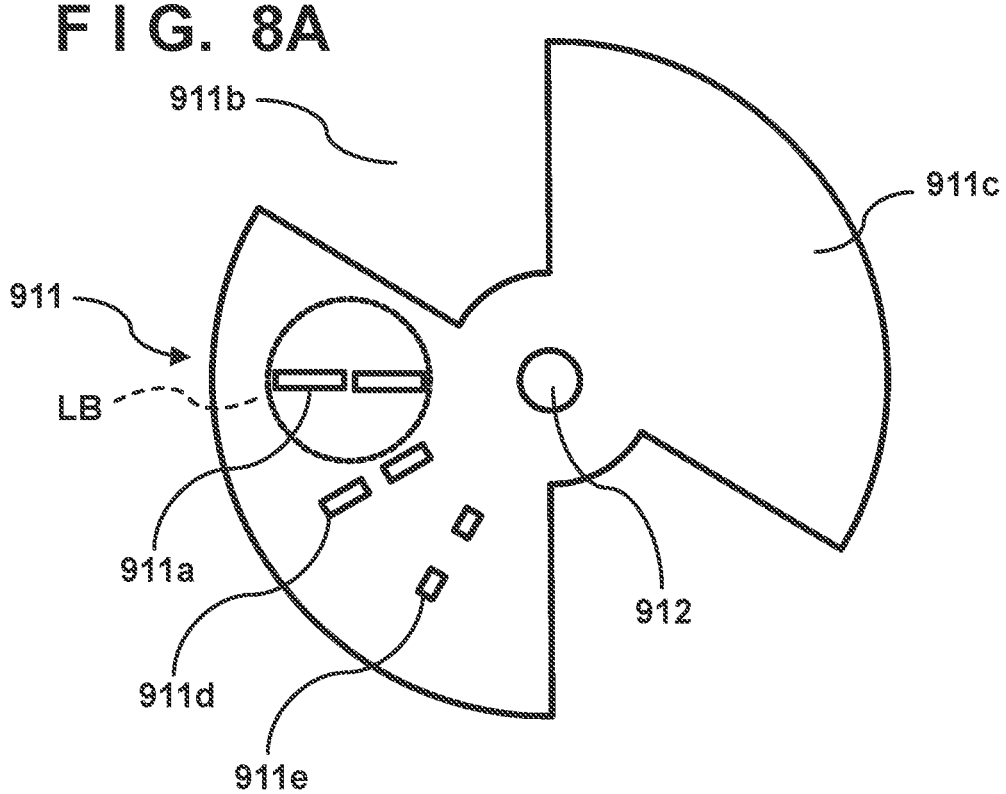
FIG. 8A is a view showing another example of the arrangement of the shutter plate.
Figure 8B:
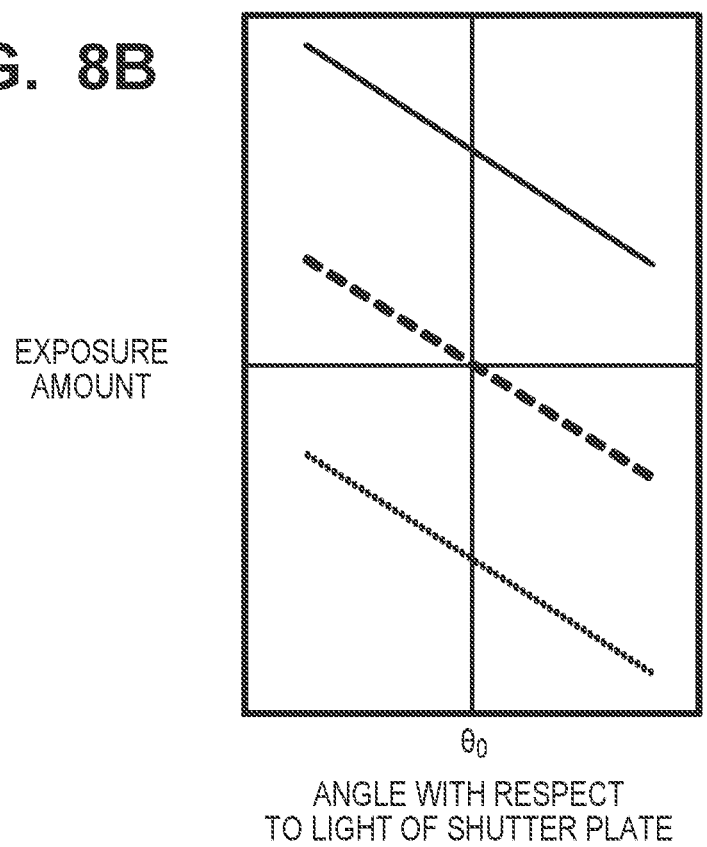
FIG. 8B is a graph exemplifying the relationship between the angle of the shutter plate and the exposure amount.

FIG. 8A illustrates the shutter plate 911 including a plurality of first passing portions 911a, 911d, and 911e. The shapes (sizes) and/or the intervals of the openings of the first passing portions 911a, 911d, and 911e are different from each other. By providing the plurality of first passing portions 911a, 911d, and 911e in the shutter plate 911 and selecting the first passing portion to be used from them, it is possible to adjust the exposure amount (preceding exposure amount) in the preceding exposure. Since merely a few types of first passing portions can be provided in the shutter plate, selecting the first passing portion to be used from the few types enables only a low resolution of adjustment of the exposure amount, and it is not easy to further improve the alignment accuracy. To the contrary, in this embodiment, since the tilt of the shutter plate 911 is variable, the resolution of adjustment of the exposure amount can be increased, and it is thus possible to further improve the alignment accuracy. FIG. 8B exemplifies the relationship between the angle of the shutter plate 911 with respect to the light LB and the exposure amount for each of the plurality of first passing portions 911a, 911d, and 911e. As shown in FIG. 8B, by providing the plurality of first passing portions 911a, 911d, and 911e, the exposure amount can be changed in a wider range than in a case in which only one first passing portion is provided. Therefore, by selecting one of the plurality of first passing portions 911a, 911d, and 911e, the adjustment range of exposure amount with respect to the angle of the shutter plate can be extended from the adjustment range of exposure amount shown in FIG. 7.

Figure 9:
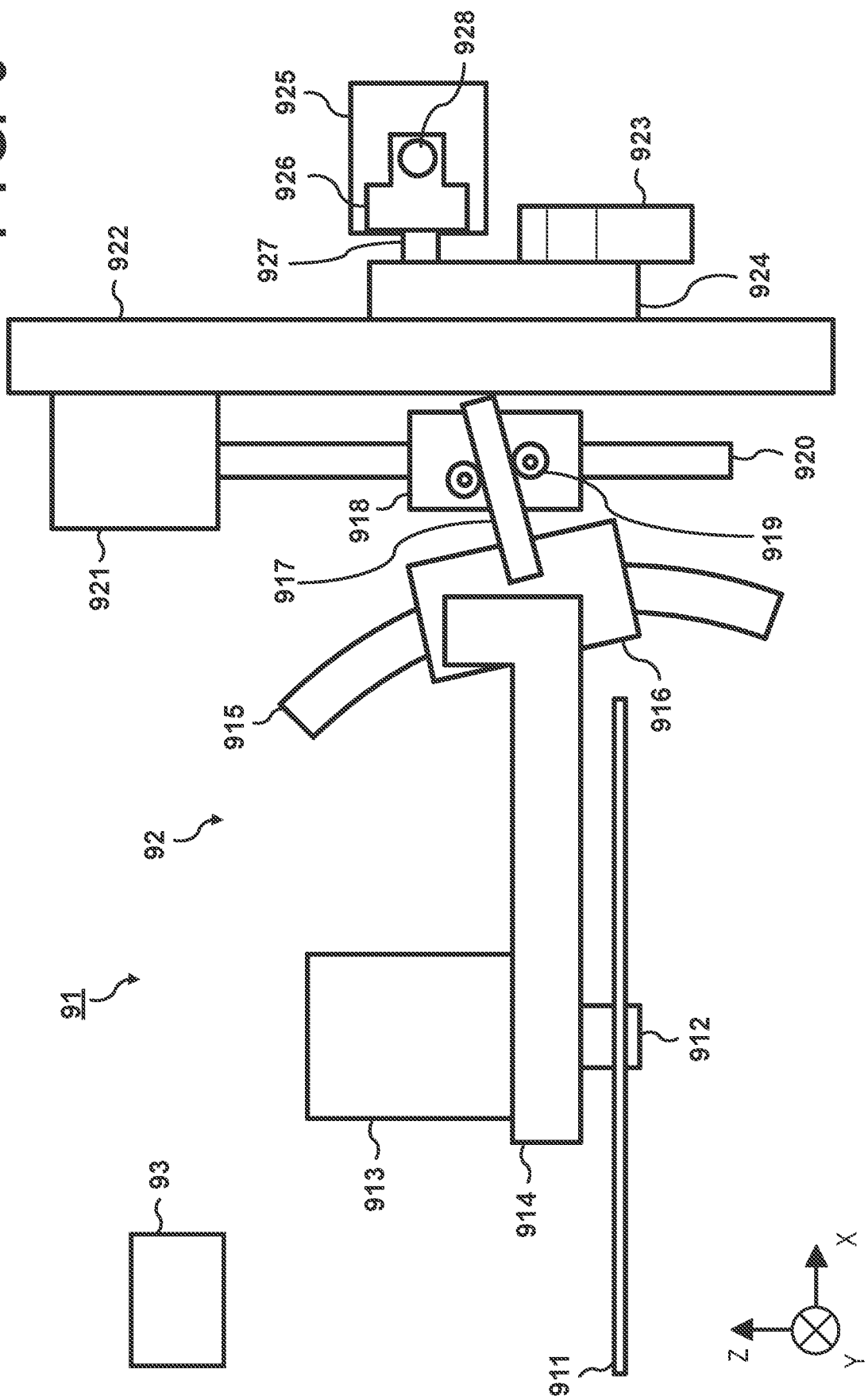
FIG. 9 is a view showing another example of the arrangement of the shutter mechanism.

FIGS. 4A and 4B show an example of the arrangement of the adjuster 92 that tilts the shutter plate 911 around the Y-axis (first axis) by the actuator 921. To the contrary, FIG. 9 shows another example of the arrangement of the adjuster 92 to which a mechanism that tilts the shutter plate 911 around the X-axis (second axis) by an actuator 925 is added. For example, the actuator 921 is fixed to a first surface of a stage 922. Further, a third slider 924 is fixed to a second surface of the stage 922 opposite to the first surface. The third slider 924 is configured to move along an R guide 923 together with the stage 922. A fourth slider 926 is attached to a ball screw 928 (driving shaft) arranged along the Y direction. The ball screw 928 is attached to the output shaft of the actuator 925. A rotational movement of the ball screw 928 generated by driving of the actuator 925 is converted into a Y-direction linear movement of the fourth slider 926. The fourth slider 926 and the third slider 924 are connected via a rod 927. Accordingly, as the fourth slider 926 is moved in the Y direction by driving of the actuator 925, the third slider 924 moves along the R guide 923. This causes the mechanism portion fixed to the stage 922 to pivot around the X axis, and the shutter plate 911 and the actuator 913 can be tilted around the X-axis. According to the arrangement as shown in FIG. 9, the number of driving shafts is increased compared to the arrangement shown in FIG. 4, so that the adjustment range of exposure amount can be extended.

The first passing portion 911a can be, for example, a round hole formed by drilling, or a square hole formed by punching or etching. Alternatively, the first passing portion 911a may be a mesh sheet or a mesh plate. Alternatively, a glass plate with a light shielding film deposited in the area other than the first passing portion 911a may be fixed to the shutter plate. The same applies to the first passing portions 911d and 911e shown in FIG. 8.

Figure 10:
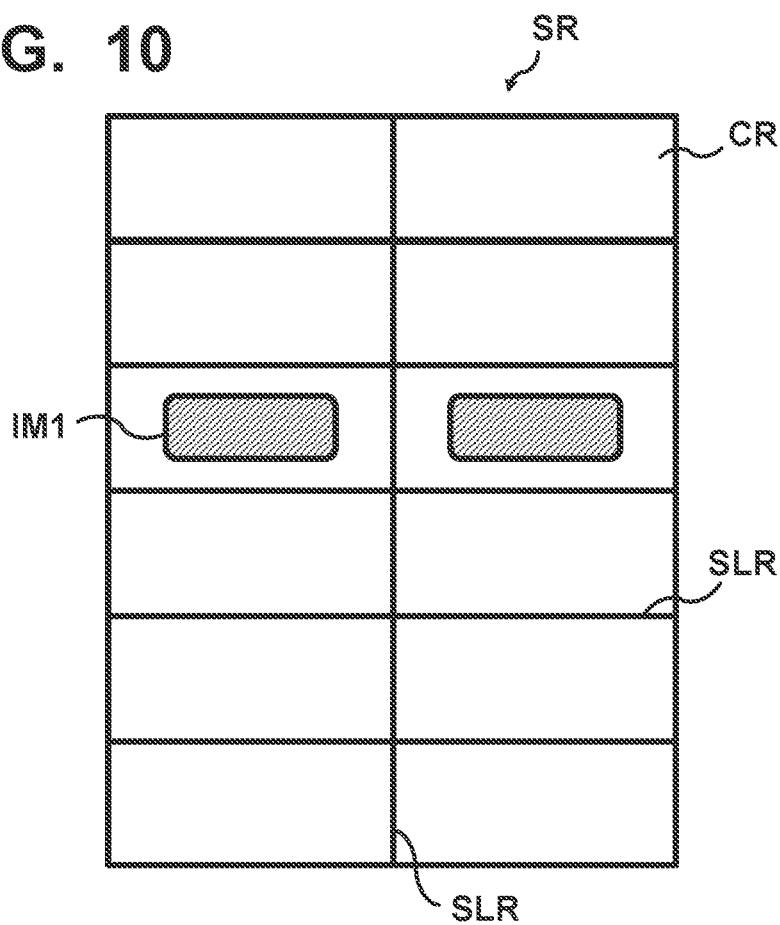
FIG. 10 is a view showing the arrangement of a shot region.

FIG. 10 exemplifies a shot region SR of the substrate S. The shot region SR can include a plurality of chip regions CR and a scribe line region SLR that separates the plurality of chip regions CR from each other. One chip region CR corresponds to one chip (die) to be manufactured. In preceding exposure, an image IM1 is formed in a preceding exposure area which is a part of the entire area of the shot region SR, and only the preceding exposure area is exposed. The preceding exposure area is an area where light having passed through the first passing portion 911a of the shutter plate 911 enters, and corresponds to the preceding exposure portion which is a portion of the entire portion of the imprint material IM on the shot region SR. In other words, in preceding exposure, only the imprint material IM (that is, preceding exposure portion) on the preceding exposure area is exposed, and the imprint material IM on the area other than the preceding exposure area is not exposed. In further other words, an operation of exposing the preceding exposure area of the shot region SR is equivalent to an operation of exposing the preceding exposure portion of the imprint material IM on the shot region SR.

The line width of a circuit pattern can be, for example, 100 nanometers or less, and can be at the 10 nanometer level when it is small. The line width of a pattern to be arranged in the scribe line region SLR is at the micrometer level, and even when it is small, it is at the several-hundred nanometer level, which is larger than the line width of the circuit pattern. In addition, the pattern density in the scribe line region SLR is smaller than the pattern density in the circuit pattern area.

When the imprint material IM on the shot region of the substrate S is brought into contact with the pattern portion P of the mold M, the concave portion forming the pattern of the pattern portion P is filled with the imprint material IM by capillary action. The filling speed of the imprint material IM is high in the circuit pattern area (chip region CR) where the line width of the pattern is small and the pattern density is high, and the filling speed of the imprint material IM is low in the scribe line region SLR. Therefore, if the imprint material IM on the scribe line region SLR undergoes preceding exposure, the viscoelasticity of the imprint material IM on the scribe line region SLR is increased and the filling speed is further lowered. Accordingly, the preceding exposure portion (preceding exposure area) can be determined such that light enters at least a part of at least one chip region CR of the plurality of chip region CR. More specifically, the preceding exposure portion (preceding exposure area) can be determined such that light enters at least a part of at least one chip region CR of the plurality of chip regions CR and no light of a significant amount enters the scribe line region SLR. Here, light of a significant amount is light of an amount that increases the viscoelasticity of the imprint material IM to a non-negligible level. The driving profile of the shutter plate 911 is determined such that light inevitably entering the scribe line region SLR by driving the shutter plate 911 does not become the light of the significant amount. The preceding exposure portion (preceding exposure area) is defined by the arrangement of the first passing portion 911a in the shutter plate 911 and driving of the shutter plate 911 by the actuators 913, 921, and 925.

In preceding exposure, it is unpreferable that the viscoelasticity of the preceding exposure portion of the imprint material on the shot region SR becomes higher than expected or leakage light strikes the imprint material on the scribe line region SLR and the filling speed becomes low. To prevent this, for example, the driving shaft 912 may be vibrated to vibrate the shutter plate 911 and disperse the portion irradiated with light.

Figure 11:
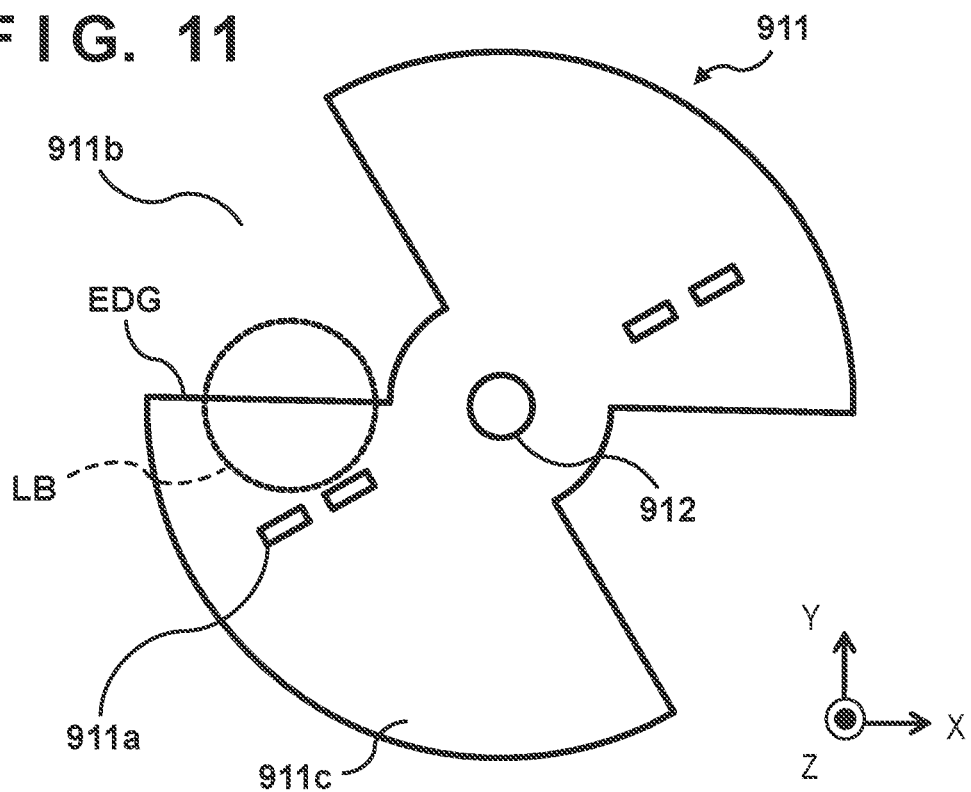
FIG. 11 is a view showing an operation of the shutter plate.

FIG. 11 shows a state during main exposure using the second passing portion 911b, which is performed after preceding exposure using the first passing portion 911a is completed. If the imprint material is cured within a very short time, the imprint material may shrink and generate heat instantaneously, which may cause a decrease in overlay accuracy. To prevent this, the pivot speed of the shutter plate 911 while an edge EDG of the shielding portion 911c defining the second passing portion 911b crosses the optical path of the light LB can be adjusted in accordance with the characteristics of the imprint material.

Figure 12:
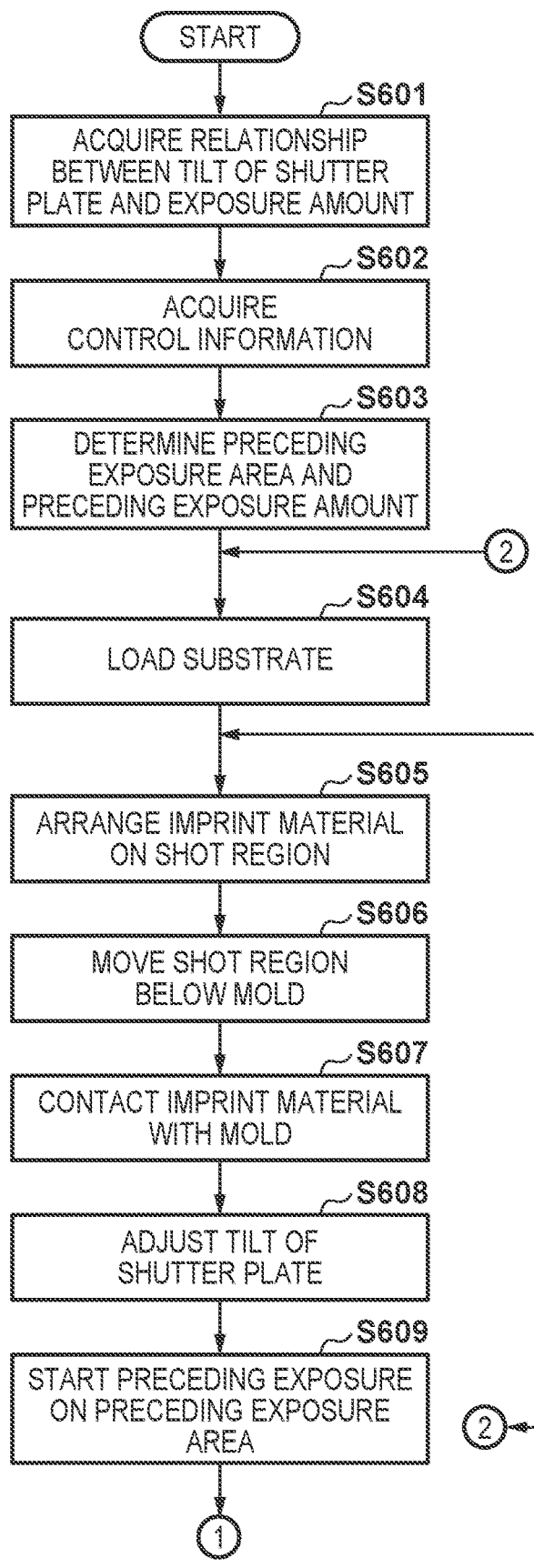
FIG. 12 is a flowchart illustrating an operation of the imprint apparatus.
Figure 12:
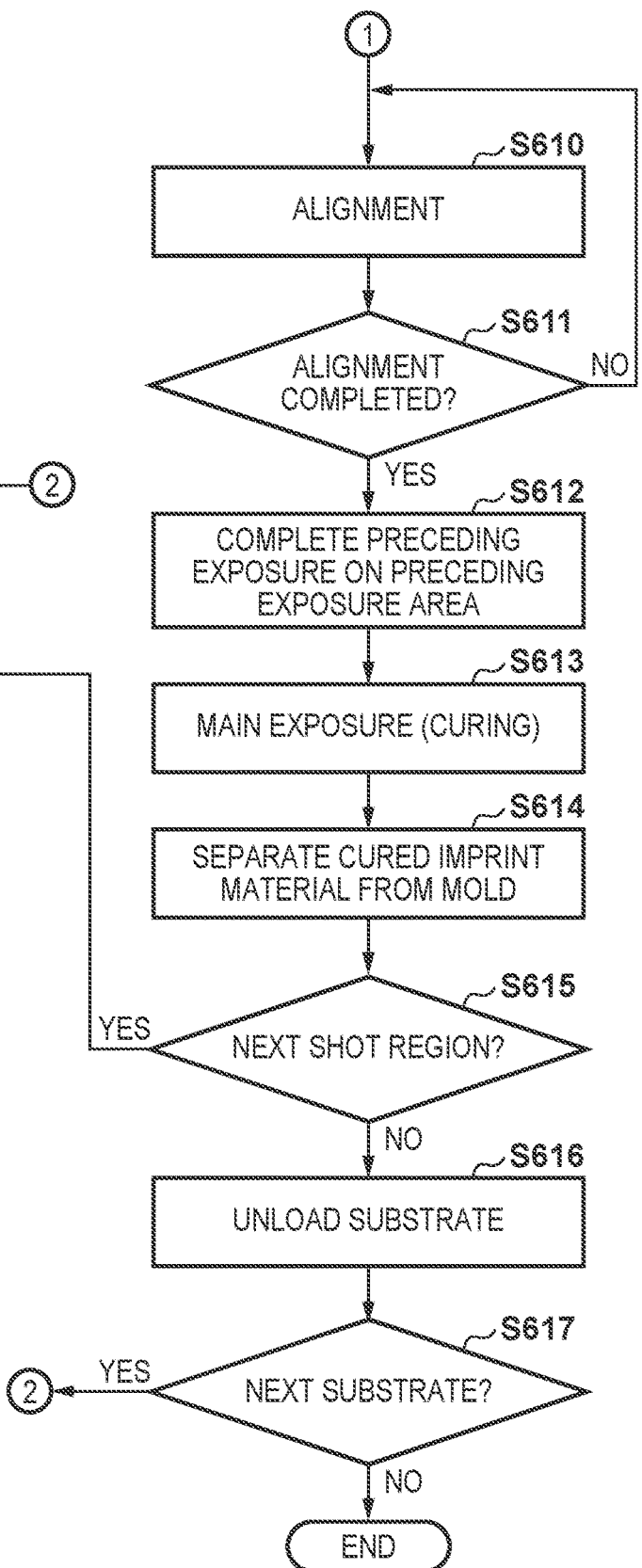

FIG. 12 exemplifies an operation (imprint method) of the imprint apparatus 100. This operation can be controlled by the control unit 12. In step S601, the control unit 12 acquires the relationship between the tilt amount of the shutter plate 911 and the exposure amount. The relationship between the tilt amount of the shutter plate 911 and the exposure amount can be obtained by moving the stage 2 such that the sensor 5 on the stage is located in the exposure area, changing the tile of the shutter mechanism 91, and measuring the exposure amount by the sensor 5. The relationship between the tilt amount of the shutter plate 911 and the exposure amount obtained by the measurement is, for example, stored in a memory of the control unit 12 which serves as a lookup table. If the plurality of first passing portions as shown in FIG. 8A are provided, the relationship between the tilt amount of the shutter plate 911 and the exposure amount is measured for each of the plurality of first passing portions.

In step S602, the control unit 12 acquires control information (process recipe) from a host control apparatus or the like. The control information can include, for example, shot layout information indicating the arrangement of a plurality of shot regions of the substrate S and chip layout information indicating the arrangement of a plurality of chip regions in each shot region. The control information may or may not include position information indicating the position of a preceding exposure area (preceding exposure portion).

In step S603, the control unit 12 determines a preceding exposure area and a preceding exposure amount. Here, if the control information includes the position information indicating the position of the preceding exposure area, the control unit 12 can determine the preceding exposure area based on the position information. On the other hand, if the control information include no position information, the control unit 12 can determine the preceding exposure area based on the chip layout information. If the plurality of first passing portions 911a, 911d, and 911e are provided as shown in FIG. 8A, one of the plurality of first passing portions 911a, 911d, and 911e can be selected in accordance with the determined preceding exposure area. The preceding exposure amount is determined based on a preceding exposure result acquired in advance. If there is no preceding exposure result, the preceding exposure amount may be determined based on a designed value. Further, the control unit 12 generates a driving profile (control information used to operate the actuator 913 and the actuator 921) of the shutter mechanism 91 in accordance with the determined preceding exposure area and preceding exposure amount. For a shot region (edge shot region) whose shape is defined by an edge of the substrate S, the control unit 12 can be configured to adjust the preceding exposure area and the preceding exposure amount in accordance with the shape.

In step S604, the control unit 12 controls conveyance of the substrate S such that the substrate S is loaded on the substrate stage 2. In step S605, the control unit 12 controls the dispenser 10 and the substrate positioning mechanism SA such that the imprint material IM is arranged in a shot region as a pattern formation target among the plurality of shot regions of the substrate S. In step S606, the control unit 12 controls the substrate positioning mechanism SA such that the shot region as the pattern formation target is moved below the mold M.

In step S607, the control unit 12 controls the relative driving mechanism DM such that the imprint material IM in the entire area of the shot region as the pattern formation target is brought into contact with the pattern portion P of the mold M.

In step S608, the control unit 12 adjusts the tilt of the shutter plate 911 based on the preceding exposure area and preceding exposure amount determined in step S603 and the relationship between the tilt amount of the shutter plate 911 and the exposure amount acquired in step S601. For example, the control unit 12 can select the tilt amount with which the preceding exposure amount is closest to the preceding exposure amount determined in step S603 in the above-described relationship.

In step S609, the control unit 12 controls the curing unit 9 (shutter mechanism 91) such that preceding exposure on the preceding exposure area (preceding exposure portion) is started (preceding exposure step). As exemplified in FIG. 2B, when the preceding exposure is started, the viscoelasticity of the preceding exposure portion is gradually increased and the relative vibration between the substrate S and the mold M can be decreased. Note that step S608 and step S609 are described as separate steps, but they may be understood as being performed in the same step. That is, the preceding exposure step in step S609 includes driving the shutter plate 911 for controlling light irradiation to the imprint material on the shot region, and it may be understood that the driving includes adjusting the tilt of the shutter plate 911 in step S608.

Step S610 is an alignment step. In step S610, the control unit 12 detects the relative position between the shot region as the pattern formation target and the mold M using the alignment scope 11 and controls the relative driving mechanism DM such that the shot region and the mold M are aligned based on the relative position. This alignment step may be performed while the preceding exposure is performed, or may be started after the preceding exposure is completed.

In step S611, the control unit 12 determines whether the relative positional error between the shot region as the pattern formation target and the mold M detected using the alignment scope 10 falls within an allowable range. If the relative positional error falls within the allowable range, the control information of the shutter mechanism 91 is stored and the process advances to step S612. Otherwise, the process returns to step S610 and the alignment operation is continued. If the process returns to step S610 and the alignment operation is continued, the control unit 12 may control the shutter mechanism 91 to change the preceding exposure amount. At this time, the preceding exposure amount may be changed by adjusting the tilt angle of the shutter plate 911.

In step S612, the control unit 12 controls the curing unit 9 (shutter mechanism 91) so as to complete the preceding exposure on the preceding exposure area (preceding exposure portion). The control unit 12 may reflect the stored control information of the shutter mechanism 91 on a next shot, a next substrate, or a next lot.

In step S613, the control unit 12 controls the curing unit 9 (shutter mechanism 91) such that the entire portion of the imprint material IM on the shot region as the pattern formation target is exposed (main exposure step). With this operation, the entire portion of the imprint material IM on the shot region as the pattern formation target is cured, and a pattern made of a cured product of the imprint material IM is formed.

In step S614, the control unit 12 controls the relative driving mechanism DM such that the pattern made of the cured product of the imprint material IM on the shot region as the pattern formation targets is separated from the mold M.

In step S615, the control unit 12 determines whether there is a shot region to form a pattern. If there is a next shot region to form a pattern, the process returns to step S605; otherwise, the process advances to step S616. In step S616, conveyance of the substrate S is controlled such that the substrate S on the substrate stage 2 is unloaded. In step S617, the control unit 12 determines whether there is the substrate S to be processed next. If there is the substrate S to be processed next, the process returns to step S604; otherwise, the operation is terminated.

Embodiment of Article Manufacturing Method

A pattern of a cured material formed by using an imprint apparatus is used permanently for at least some of various articles, or is used temporarily when manufacturing various articles. The articles include an electric circuit element, an optical element, a MEMS, a recording element, a sensor, and a mold. Examples of the electric circuit element are a volatile or nonvolatile semiconductor memory such as a DRAM, an SRAM, a flash memory, or an MRAM and a semiconductor element such as an LSI, a CCD, an image sensor, or an FPGA. An example of the mold is an imprinting mold.

The pattern of a cured material is used unchanged as a constituent member for at least some of the foregoing articles, or is temporarily used as a resist mask. The resist mask is removed after etching, ion implantation, or the like is performed in a substrate processing step.

Next, the article manufacturing method will be described. In step SA of FIG. 13, a substrate 1z which is a silicon substrate or the like on whose surface a processing target material 2z such as an insulator is formed is prepared, and next, an imprint material 3z is applied to the surface of the processing target material 2z by an ink-jet method. A state in which the imprint material 3z in the form of a plurality of droplets is applied onto the substrate is shown here.

Figure 13:
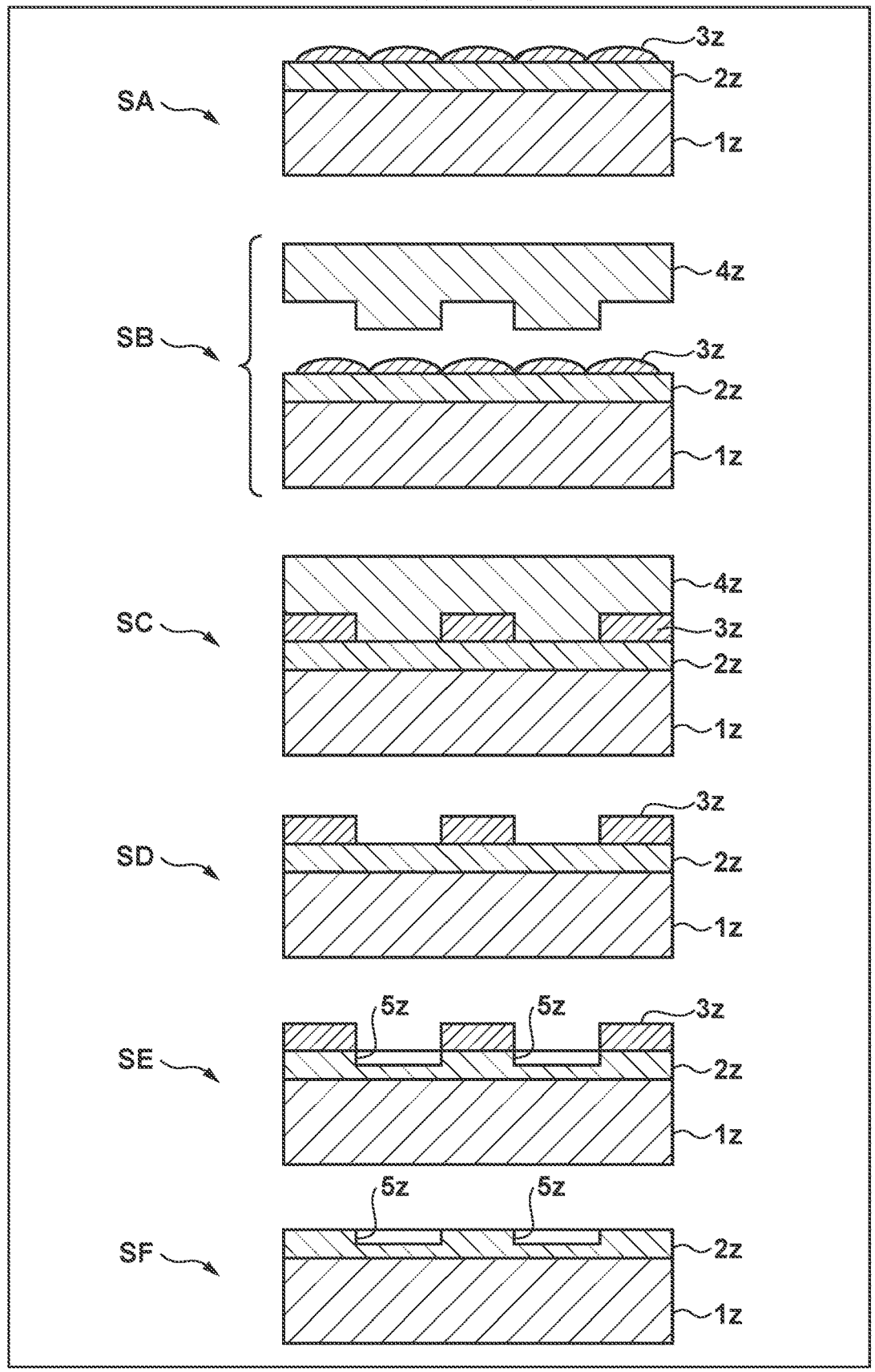
FIG. 13 is a view for explaining an article manufacturing method.

As shown in step SB of FIG. 13, a side of an imprinting mold 4z on which its three-dimensional pattern is formed faces the imprint material 3z on the substrate. In step SC of FIG. 13, the substrate 1z to which the imprint material 3z has been applied and the mold 4z are brought into contact, and pressure is applied. Gaps between the mold 4z and the processing target material 2z is filled with the imprint material 3z. When the imprint material 3z is irradiated with light as curing energy through the mold 4z in this state, the imprint material 3z is cured.

In step SD of FIG. 13, when the mold 4z and the substrate 1z are separated after the imprint material 3z is cured, a pattern of the cured material of the imprint material 3z is formed on the substrate 1z. The pattern of this cured product has a shape such that the concave portion of the mold corresponds to the convex portion of the cured product, and the convex portion of the mold corresponds to the concave portion of the cured product; that is, the three-dimensional pattern of the mold 4z is transferred to the imprint material 3z.

In step SE of FIG. 13, when the pattern of the cured material is etched as an etching resistant mask, portions out of the surface of the processing target material 2z where the cured material is not present or thinly remains are removed, and grooves 5z are achieved. In step SF of FIG. 13, when the pattern of the cured material is removed, it is possible to achieve an article in which the grooves 5z are formed on the surface of the processing target material 2z. The pattern of the cured product is removed here; however, the pattern of the cured product may be used as, for example, an interlayer dielectric film included in the semiconductor element or the like, that is, the constituent member of the article without removing it after processing.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), region only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-061107, filed Mar. 30, 2020, which is hereby incorporated by reference herein in its entirety.

What is claimed is:

1. An imprint apparatus that forms a pattern on a shot region of a substrate having a plurality of chip regions and a scribe line region that separates the plurality of chip regions from each other, by curing an imprint material on the shot region by light irradiation in a state in which the imprint material is in contact with a mold, the apparatus comprising:
    a shutter plate;
    an adjuster configured to adjust a state of the shutter plate to control the light irradiation to the imprint material on the shot region; and
    a control unit,
    wherein the shutter plate includes a plurality of first passing portions used to irradiate a portion of an entire area of the imprint material on the shot region with light, and the adjuster is configured to adjust a tilt of the shutter plate, and
    wherein the adjuster includes:
        a first actuator configured to cause the shutter plate to pivot via a drive shaft to switch the state of the shutter plate between a first state in which light having passed through one of the first passing portions irradiates the portion of the entire area and a second state in which light having passed through a second passing portion irradiates the entire area; and
        a second actuator configured to tilt the shutter plate and the drive shaft, and
    wherein the control unit is configured to:
        select a first passing portion to be used among the plurality of first passing portions based on an arrangement of the plurality of chip regions in the shot region; and
        control an exposure amount in a preceding exposure before alignment by referring to a relationship between tilt amounts of the shutter plate and exposure amounts for the selected first passing portion among previously obtained relationships between tilt amounts of the shutter plate and exposure amounts for each of the plurality of first passing portions.

2. The apparatus according to claim 1, further comprising a relative driving mechanism configured to change a relative position between the substrate and the mold, wherein the apparatus is configured to perform, before alignment between the shot region and the mold by the relative driving mechanism is completed, the preceding exposure in which the imprint material on the shot region is irradiated with light, and
    wherein, in the preceding exposure, the adjuster is configured to set the shutter plate in the first state by the first actuator and adjust the tilt of the shutter plate by the second actuator.

3. The apparatus according to claim 2, wherein, in a main exposure in which the imprint material on the shot region is irradiated with light after the alignment is completed, the adjuster is configured to set the shutter plate in the second state by the first actuator.

4. The apparatus according to claim 1, wherein the second actuator includes
    a third actuator configured to tilt the shutter plate around a first axis perpendicular to an optical axis of light passing through the first passing portion, and
    a fourth actuator configured to tilt the shutter plate around a second axis perpendicular to the optical axis and the first axis.

5. The apparatus according to claim 1,
    wherein the shutter plate includes the first passing portion that permits passage of light of a first size for irradiating the portion of the entire area of the imprint material on the shot region in the preceding exposure before alignment and the second passing portion that permits passage of light of a second size, different from the first size, for irradiating the entire area of the imprint material on the shot region in a main exposure after alignment, and
    wherein the control unit is further configured to:
        determine a size of the portion to be irradiated during the preceding exposure such that light enters parts of one or more chip regions of the plurality of chip regions during the preceding exposure and no light enters the scribe line region during the preceding exposure;
        control the adjuster to adjust a first tilt amount of the shutter plate, based on the determined size of the portion of the entire area, to adjust the first size of the light passing through the first passing portion to correspond to the determined size of the portion to be irradiated during the preceding exposure, such that the light passing through the first passing portion to the imprint material on the shot region only irradiates the parts of the portion of the entire area in the preceding exposure; and
        control the adjuster to adjust a second tilt amount of the shutter plate to adjust the size of the light passing through the second passing portion to correspond to the second size to irradiate the entire area in the main exposure.

6. An imprint method in which a pattern is formed on a shot region of a substrate having a plurality of chip regions and a scribe line region that separates the plurality of chip regions from each other, by curing an imprint material on the shot region by light irradiation in a state in which the imprint material is in contact with a mold, the method comprising:
    adjusting a state of a shutter plate to control the light irradiation to the imprint material on the shot region by adjusting a tilt of the shutter plate, the shutter plate including a plurality of first passing portions used to irradiate a portion of an entire area of the imprint material on the shot region with light, and the adjuster is configured to adjust a tilt of the shutter plate, wherein the adjusting includes:
        a first actuating to cause the shutter plate to pivot via a drive shaft to switch the state of the shutter plate between a first state in which light having passed through one of the first passing portion irradiates the portion of the entire area and a second state in which light having passed through a second passing portion irradiates the entire area; and a second actuating to tilt the shutter plate and the drive shaft;

selecting a first passing portion to be used among the plurality of first passing portions based on an arrangement of the plurality of chip regions in the shot region; and controlling an exposure amount in a preceding exposure before alignment by referring to a relationship between tilt amounts of the shutter plate and exposure amounts for the selected first passing portion among previously obtained relationships between tilt amounts of the shutter plate and exposure amounts for each of the plurality of first passing portions.

7. The imprint method according to claim 6, further comprising:

determining a size of the portion of the entire area of the imprint material on the shot region to be irradiated during the preceding exposure, before alignment, such that light enters parts of one or more chip regions of the plurality of chip regions during the preceding exposure and no light enters the scribe line region during the preceding exposure;

adjusting a tilt amount of the shutter plate having the first passing portion that permits passage of light of a first size for irradiating the portion of the entire area in the preceding exposure before alignment and the second passing portion that permits passage of light of a second size, different from the first size, for irradiating the entire area of the imprint material on the shot region in a main exposure after alignment;

performing the preceding exposure in which the parts of the one or more chip regions of the plurality of chip regions of the entire area of the imprint material on the shot region are irradiated with light by driving the shutter plate to adjust a first tilt amount to adjust the first size of light irradiation to the imprint material on the shot region to correspond to the determined size of the portion to be irradiated during the preceding exposure;

aligning the shot region and the mold during performing the preceding exposure or after the preceding exposure is completed; and performing the main exposure in which the entire area of the imprint material on the shot region is irradiated with light by driving the shutter plate to adjust a second tilt amount of the shutter plate to adjust the size of the light passing through the second passing portion to correspond to the second size after the aligning.

8. An article manufacturing method comprising:

forming a pattern on a substrate using an imprint apparatus that forms the pattern on a shot region of the substrate having a plurality of chip regions and a scribe line region that separates the plurality of chip regions from each other, by curing an imprint material on the shot region by light irradiation in a state in which the imprint material is in contact with a mold, the apparatus comprising:

a shutter plate;

an adjuster configured to adjust a state of the shutter plate to control the light irradiation to the imprint material on the shot region; and a control unit, wherein the shutter plate includes a plurality of first passing portions used to irradiate a portion of an entire area of the imprint material on the shot region with light, and the adjuster is configured to adjust a tilt of the shutter plate, and wherein the adjuster includes:

a first actuator configured to cause the shutter plate to pivot via a drive shaft to switch the state of the shutter plate between a first state in which light having passed through one of the first passing portion irradiates the portion of the entire area and a second state in which light having passed through a second passing portion irradiates the entire area; and a second actuator configured to tilt the shutter plate and the drive shaft, and wherein the control unit is configured to:

select a first passing portion to be used among the plurality of first passing portions based on an arrangement of the plurality of chip regions in the shot region; and control an exposure amount in a preceding exposure before alignment by referring to a relationship between tilt amounts of the shutter plate and exposure amounts for the selected first passing portion among previously obtained relationships between tilt amounts of the shutter plate and exposure amounts for each of the plurality of first passing portions; and processing the substrate on which the pattern has been formed in the forming, wherein an article is manufactured from the substrate having undergone the processing.

9. The article manufacturing method according to claim 8, wherein the shutter plate includes the first passing portion that permits passage of light of a first size for irradiating the portion of the entire area of the imprint material on the shot region in the preceding exposure before alignment and the second passing portion that permits passage of light of a second size, different from the first size, for irradiating the entire area of the imprint material on the shot region in a main exposure after alignment, and wherein the control unit is further configured to:

determine a size of the portion to be irradiated during the preceding exposure such that light enters parts of one or more chip regions of the plurality of chip regions during the preceding exposure and no light enters the scribe line region during the preceding exposure;

control the adjuster to adjust a first tilt amount of the shutter plate, based on the determined size of the portion of the entire area, to adjust the first size of the light passing through the first passing portion to correspond to the determined size of the portion to be irradiated during the preceding exposure, such that the light passing through the first passing portion to the imprint material on the shot region only irradiates the parts of the portion of the entire area in the preceding exposure; and control the adjuster to adjust a second tilt amount of the shutter plate to adjust the size of the light passing through the second passing portion to correspond to the second size to irradiate the entire area in the main exposure.

* * * * *